United States Patent
Yoshikawa et al.

(10) Patent No.: US 9,816,198 B2
(45) Date of Patent: Nov. 14, 2017

(54) METHOD FOR PRODUCING ZINC OXIDE SINGLE CRYSTAL

(71) Applicant: NGK INSULATORS, LTD., Nagoya-Shi (JP)

(72) Inventors: Jun Yoshikawa, Nagoya (JP); Katsuhiro Imai, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 455 days.

(21) Appl. No.: 14/453,887

(22) Filed: Aug. 7, 2014

(65) Prior Publication Data
US 2014/0338586 A1 Nov. 20, 2014

Related U.S. Application Data

(63) Continuation of application No. PCT/JP2013/054594, filed on Feb. 22, 2013.

(30) Foreign Application Priority Data

Mar. 13, 2012 (JP) .................... 2012-056226
Jul. 2, 2012 (JP) .................... 2012-148571

(51) Int. Cl.
*C30B 1/04* (2006.01)
*C01G 9/02* (2006.01)
(Continued)

(52) U.S. Cl.
CPC ............... *C30B 1/04* (2013.01); *C01G 9/02* (2013.01); *C23C 4/11* (2016.01); *C23C 4/18* (2013.01);
(Continued)

(58) Field of Classification Search
CPC ......... C30B 1/04; C30B 29/16; C30B 35/007; G03B 2227/325; G03B 27/32;
(Continued)

(56) References Cited

U.S. PATENT DOCUMENTS

| 2003/0084838 A1* | 5/2003 | McCandlish ............. C30B 7/00 117/68 |
| 2006/0125352 A1* | 6/2006 | Sakashita ............... C23C 24/04 310/358 |
| 2009/0044745 A1 | 2/2009 | Sekiwa et al. |

FOREIGN PATENT DOCUMENTS

| JP | 2004-315361 A1 | 11/2004 |
| JP | 2006-188046 A1 | 7/2006 |

(Continued)

OTHER PUBLICATIONS

The Origin of the Fluorescence in Self-Activated ZnS, CdS, and ZnO, Kroger et al., The Journal of Chemical Physics vol. 22, No. 2 Feb. 1954.*

(Continued)

*Primary Examiner* — Robert M Kunemund
*Assistant Examiner* — Hua Qi
(74) *Attorney, Agent, or Firm* — Burr & Brown, PLLC (57) ABSTRACT

The present invention provides a method capable of stably producing a zinc oxide single crystal in which a large amount of dopant forms a solid solution at a high level of productivity and reproducibility without using a harmful substance. The method of the present invention comprises providing a raw material powder that is mainly composed of zinc oxide, comprises at least one dopant element selected from B, Al, Ga, In, C, F, Cl, Br, I, H, Li, Na, K, N, P, As, Cu, and Ag in a total amount of 0.01 to 1 at %, and is substantially free of a crystal phase other than zinc oxide, and injecting the raw material powder to form a film mainly composed of zinc oxide on a seed substrate comprising a zinc oxide single crystal and also to crystallize the formed film in a solid phase state.

5 Claims, 4 Drawing Sheets

(51) Int. Cl.
   *C30B 29/16* (2006.01)
   *C30B 35/00* (2006.01)
   *C23C 24/04* (2006.01)
   *C23C 4/18* (2006.01)
   *C23C 4/11* (2016.01)

(52) U.S. Cl.
   CPC .............. *C23C 24/04* (2013.01); *C30B 29/16* (2013.01); *C30B 35/007* (2013.01); *C01P 2002/52* (2013.01)

(58) Field of Classification Search
   CPC ..... G03F 7/0022; C01G 9/02; C01P 2002/52; C23C 24/04; C23C 4/11; C23C 4/18
   See application file for complete search history.

(56) References Cited

FOREIGN PATENT DOCUMENTS

| | | | |
|---|---|---|---|
| JP | 2009087898 A | * | 4/2009 |
| JP | 4371884 B2 | | 11/2009 |
| JP | 2010070448 A | * | 4/2010 |
| JP | 2011-073965 A1 | | 4/2011 |
| WO | 2007/100146 A1 | | 9/2007 |

OTHER PUBLICATIONS

Supervised by Jun Akedo, "Aerosol Deposition (AD) Process: The Basic and Applications—Novel Ceramic Coating Technology with Room Temperature Impact Consolidation (RTIC)," CMC Publishing Co., Ltd., Jun. 30, 2008, pp. 45-46.

International Preliminary Report on Patentability (Application No. PCT/JP2013/054594) dated Sep. 25, 2014 (with English translation).

* cited by examiner

METHOD FOR PRODUCING ZINC OXIDE SINGLE CRYSTAL

CROSS-REFERENCE TO RELATED APPLICATIONS

This application is a continuation application of PCT/JP2013/054594 filed Feb. 22, 2013, which claims priority to Japanese Patent Application No. 2012-56226 filed on Mar. 13, 2012 and Japanese Patent Application No. 2012-148571 filed on Jul. 2, 2012, the entire disclosures of which are incorporated herein by reference.

BACKGROUND OF THE INVENTION

1. Field of the Invention

The present invention relates to a method for producing a zinc oxide single crystal.

2. Description of the Related Art

Zinc oxide (ZnO) is a material used in a broad range of applications such as pigments, cosmetics, piezoelectric devices, varistors, and gas sensors, and in recent years it has been expected that zinc oxide can be applied to light emitting devices such as light emitting diodes (LEDs) due to its wide band gap and excellent optical properties.

A hydrothermal synthesis method (e.g., Patent Document 1 (JP2004-315361A)) and a liquid phase epitaxial method (LPE method) (e.g., Patent Document 2 (WO2007/100146) are known as methods for growing zinc oxide single crystals. Although the productivity of the hydrothermal synthesis method is comparatively high, and zinc oxide single crystals produced thereby are commercially available, the hydrothermal synthesis method is problematic in that high-concentration doping required for controlling electrical properties is difficult. On the other hand, the LPE method, while it enables high-concentration doping, is problematic in that the productivity is low and, further, harmful PbO and $Bi_2O_3$ need to be used as fusing agents.

Meanwhile, as a technique that enables formation of a dense ceramic film at room temperature, an aerosol deposition method (hereinafter also referred to as an AD method) has recently been attracting attention. It is considered that, in this AD method, when raw material particles that have been formed into an aerosol collide with a substrate at high speed, the particles plastically deform due to the generated stress, and a film is formed by the mechanochemical reaction between the activated particle surface and the substrate. However, it is known that with the AD method the reproducibility of film formation is generally low. One reason for this is that the aerosol concentration is affected by, for example, a subtle change in particle size distribution and is unlikely to be stable (see Patent Document 3 (JP4371884B)). Also, it is known that with the AD method the ability of particles to plastically deform during film formation is dependent on, for example, the particle diameter and the components of the raw material (Non-Patent Document 1 (supervised by Jun Akedo, "Aerosol Deposition (AD) Process: The Basic and Applications—Novel Ceramic Coating Technology with Room Temperature Impact Consolidation (RTIC)", CMC Publishing Co., Ltd., published on Jun. 30, 2008, pp. 45-46)). In particular, with zinc oxide, there is a problem in that the ability of particles to plastically deform is poor, and the reproducibility of the AD deposition is low.

CITATION LIST

Patent Documents

Patent Document 1: JP2004-315361A
Patent Document 2: WO2007/100146
Patent Document 3: JP4371884B

Non-Patent Document

Non-Patent Document 1: Supervised by Jun Akedo, "Aerosol Deposition (AD) Process: The Basic and Applications—Novel Ceramic Coating Technology with Room Temperature Impact Consolidation (RTIC)", CMC Publishing Co., Ltd., published on Jun. 30, 2008, pp. 45-46

SUMMARY OF THE INVENTION

The inventors have currently found that using a raw material being a zinc oxide powder in which a specific dopant element forms a solid solution and adopting a technique including injection film formation, such as an AD method, in combination with solid phase growth can stably produce a zinc oxide single crystal in which a large amount of dopant forms a solid solution at a high level of productivity and reproducibility without using a harmful substance.

Accordingly, an object of the present invention is to provide a method capable of stably producing a zinc oxide single crystal in which a large amount of dopant forms a solid solution at a high level of productivity and reproducibility without using a harmful substance.

According to an aspect of the present invention, there is provided a method for producing a zinc oxide single crystal, comprising the steps of:

providing a raw material powder that is mainly composed of zinc oxide, comprises at least one dopant element selected from the group consisting of B, Al, Ga, In, C, F, Cl, Br, I, H, Li, Na, K, N, P, As, Cu, and Ag in a total amount of 0.01 at % or greater and 1 at % or less, and is substantially free of a crystal phase other than zinc oxide; and injecting the raw material powder to form a film mainly composed of zinc oxide on a seed substrate comprising a zinc oxide single crystal and also to crystallize the formed film in a solid phase state, thereby obtaining a zinc oxide single crystal in which the dopant element forms a solid solution.

DETAILED DESCRIPTION OF THE INVENTION

Method for Producing Zinc Oxide Single Crystal

In the method for producing a zinc oxide single crystal according to the present invention, a zinc oxide single crystal is obtained by injecting a zinc oxide raw material powder that is mainly composed of zinc oxide and that comprises a predetermined amount of a specific dopant element to form a film mainly composed of zinc oxide on a seed substrate comprising a zinc oxide single crystal and also to crystallize the formed film in a solid phase state. This step of obtaining a zinc oxide single crystal is preferably carried out while heating at a temperature that enables growth of a zinc oxide single crystal, more preferably 900° C. or higher, and even more preferably 1000 to 1400° C. Thus, the production method of the present invention is based on a technique in which injection film formation and solid phase growth are combined, and this technique has various advantages over the hydrothermal synthesis method and the liquid phase epitaxial method (LPE method) that are conventional methods for producing a zinc oxide single crystal. That is, with the hydrothermal synthesis method, it is difficult to simultaneously control the solubility of a dopant and the pH in a raw material solution, and it is thus troublesome to produce a zinc oxide single crystal containing a dopant in a high concentration. On the other hand, the LPE method enables high-concentration doping, but the productivity is low, and harmful PbO and $Bi_2O_3$ need to be used as fusing agents. In contrast, according to the method of the present invention, which is based on the combination of injection film formation and solid phase growth, a zinc oxide powder comprising a predetermined dopant element is used as a raw material, a single crystal is grown by taking advantage of solid phase growth, and it is thereby possible to produce a zinc oxide single crystal in which a large amount of dopant forms a solid solution at a high level of productivity without using a harmful substance. Moreover, the method of the present invention can stably achieve a high rate of film formation in injection film formation at a high level of reproducibility. Preferable techniques of such injection film formation include an aerosol deposition method (AD method) and a powder jet deposition method (PJD method), with the AD method being more preferable, but various film forming techniques that use injection can be employed as long as the aforementioned effects are obtained.

The aforementioned effects of the present invention are achieved by using as a zinc oxide raw material powder a raw material powder that is mainly composed of zinc oxide, comprises at least one dopant element selected from the group consisting of B, Al, Ga, In, C, F, Cl, Br, I, H, Li, Na, K, N, P, As, Cu, and Ag in a total amount of 0.01 at % or greater and 1 at % or less, and is substantially free of a crystal phase other than zinc oxide. The dopant element content in the zinc oxide raw material powder is preferably 0.05 to 0.8 at % and more preferably 0.1 to 0.6 at %, but it is desirably such an amount that a crystal phase other than zinc oxide (i.e., a heterogeneous phase) is not generated. Thus, allowing an element different from oxygen and zinc as a dopant to form a solid solution in the raw material zinc oxide powder makes it possible to greatly enhance the reproducibility of injection film formation by, for example, the AD method. Although the reason for this is not clear, it is presumed that when a solid solution is not formed by a dopant, the deformability of particles is poor, and therefore the range of an aerosol state (e.g., the particle size distribution of particles present in an aerosol) in which a high film formation rate is exerted is very narrow. On the other hand, it is presumed that when a solid solution is formed by a dopant, atomic defects or the like resulting from the formation of a solid solution by the dopant enhances the deformability of particles, the range of an aerosol state in which a high film formation rate is achievable is thus broadened, and the reproducibility of film formation is enhanced. That is, in a zinc oxide powder in which a dopant element forms a solid solution, formation of a solid solution by an atom that has a different valency and an ionic radius causes pores and distortion to be formed in the crystal, and therefore the crystal structure is likely to become distorted. It is considered that such a zinc oxide powder having a crystal structure that is likely to become distorted plastically deforms without undergoing brittle fracture when subjected to stress, and therefore can easily form a film, thus resulting in an increased film formation rate.

Also, according to the method of the present invention, a crystal having better orientation and density can be prepared. The reason for this is presumed to be as follows. For example, in the aerosol deposition method (AD method), the powder jet deposition method (PJD method), and like methods carried out under reduced pressure, film formation is achieved through repetition of a phenomenon in which a powder collided with a substrate plastically deforms due to the impact of collision and is thus densely adhered. However, as the thickness increases, pores are likely to remain in some cases. On the other hand, in the method of the present invention, since the formed film in a solid phase state is crystallized, a dense film structure created by film formation thickens while sequentially undergoing single crystallization, therefore pores are unlikely to be generated, and a crystal having better orientation and density can be prepared. Although zinc oxide has a high melting point and cannot be molten, the method of the present invention makes it easy to control the dopant. It is presumed that, in this way, the method of the present invention enables preparation of a practical crystal (e.g., a single crystal).

Zinc oxide in the raw material powder preferably has an a-axis lattice constant of 3.246 to 3.252 Å and a c-axis lattice constant of 5.204 to 5.210 Å and more preferably has an a-axis lattice constant of 3.248 to 3.251 Å and a c-axis lattice constant of 5.205 to 5.208 Å. Commonly used zinc oxide has an a-axis length of 3.2498 Å and a c-axis length of 5.2066 Å according to ICDD 36-1451 and, therefore, with the lattice constants being within the aforementioned ranges, the zinc oxide raw material powder has lattice constants close to those of a non-doped zinc oxide single crystal, and a zinc oxide single crystal having high crystallinity can be obtained.

Meanwhile, addition of a dopant is generally contradictory to the preparation of a zinc oxide single crystal having high crystallinity. That is, when doping with one element is carried out, expansion or contraction of the crystal lattice may occur due to the difference between the ionic radii of the dopant, which is a substituting element, and zinc (Zn) or oxygen (O), which is a substituted element. Accordingly, when growing a doped zinc oxide single crystal using a non-doped zinc oxide single crystal as a seed crystal, a lattice mismatch with the seed crystal may occur as the crystal lattice to be grown expands or contracts. As a result, a newly grown doped zinc oxide single crystal develops a large number of defects, and it is not possible to obtain sufficiently high crystallinity.

As one technique to address this point, according to a preferable embodiment of the present invention, the zinc oxide raw material powder can comprise at least one group 3B element selected from B, Al, Ga, and In in an amount of 0.01 at % or greater and 0.99 at % or less, and comprise at least one group 7B element selected from the group consisting of F, Cl, Br, and I in an amount of 0.01 at % or greater and 0.99 at % or less. In other words, the zinc oxide raw material powder used in this embodiment comprises two elements, i.e., a group 3B element and a group 7B element. That is, using as a raw material a zinc oxide powder comprising not only a group 3B element (such as Al or Ga) but also a group 7B element (such as Cl or Br) as dopants and growing a zinc oxide single crystal on a non-doped zinc oxide seed crystal make it possible to obtain a zinc oxide single crystal having not only high electrical conductivity but also high crystallinity. For example, while Al and Ga can substitute for Zn to form a solid solution, the ionic radii of $Al^{3+}$ and $Ga^{3+}$ are smaller than that of $Zn^{2+}$, and therefore the crystal lattice contracts as the amounts of Al and Ga forming a solid solution increase. On the other hand, while $Cl^-$ and $Br^-$ substitute for O to form a solid solution, the ionic radii of $Cl^-$ and $Br^-$ are larger than that of $O^{2-}$, and therefore the crystal lattice expands as the amounts of Cl and Br forming a solid solution increase. Therefore, appropriate adjustment of these amounts offsets the contraction and the expansion of the crystal lattice, and makes it possible to obtain a doped zinc oxide powder that has lattice constants close to those of the non-doped zinc oxide single crystal used as a seed crystal. The use of such a powder enables growth of a zinc oxide single crystal having not only high electrical conductivity but also high crystallinity while suppressing the lattice mismatch with the seed crystal. Moreover, a group 3B element substitutes for Zn, a group 7B element substitutes for O, and both function as n-type dopants, and therefore a zinc oxide single crystal in which a group 3B element and a group 7B element form a solid solution can have high electrical conductivity.

As described above, the zinc oxide raw material powder according to this embodiment comprises at least one group 3B element selected from B, Al, Ga, and In and at least one group 7B element selected from F, Cl, Br, and I in a solid solution state. The amount of the group 3B element forming a solid solution in the zinc oxide single crystal is preferably 0.01 to 0.99 at %, more preferably 0.05 to 0.8 at %, and even more preferably 0.1 to 0.6 at %. The amount of the group 7B element forming a solid solution in the zinc oxide raw material powder is preferably 0.01 to 0.99 at %, more preferably 0.01 to 0.4 at %, and even more preferably 0.02 to 0.2 at %. It is desirable to balance the amounts of the group 3B element and the group 7B element forming a solid solution so as to offset the above-mentioned expansion and contraction of the crystal lattice and to obtain a zinc oxide crystal with lattice constants close to those of a non-doped zinc oxide single crystal. Accordingly, it is preferable that the group 3B element is Al and/or Ga and the group 7B element is Cl and/or Br, and more preferably the group 3B element is Al and the group 7B element is Br.

The dopant element according to another preferable embodiment of the present invention is an n-type dopant element which is at least one selected from the group consisting of B, Al, Ga, In, C, F, Cl, Br, and I, and more preferably at least one selected from the group consisting of B, Al, Ga, and In. The dopant element according to yet another preferable embodiment of the present invention is a p-type dopant element which is at least one selected from the group consisting of H, Li, Na, K, N, P, As, C, Cu, and Ag and more preferably at least one selected from the group consisting of Li, N, P, C, Cu, and Ag. Irrespective of the type of dopant, it is possible according to the method of the present invention to stably produce a zinc oxide single crystal in which a large amount of dopant forms a solid solution at a high level of productivity and reproducibility and thereby possible to sufficiently impart the desired properties to the zinc oxide single crystal.

Figure 1:
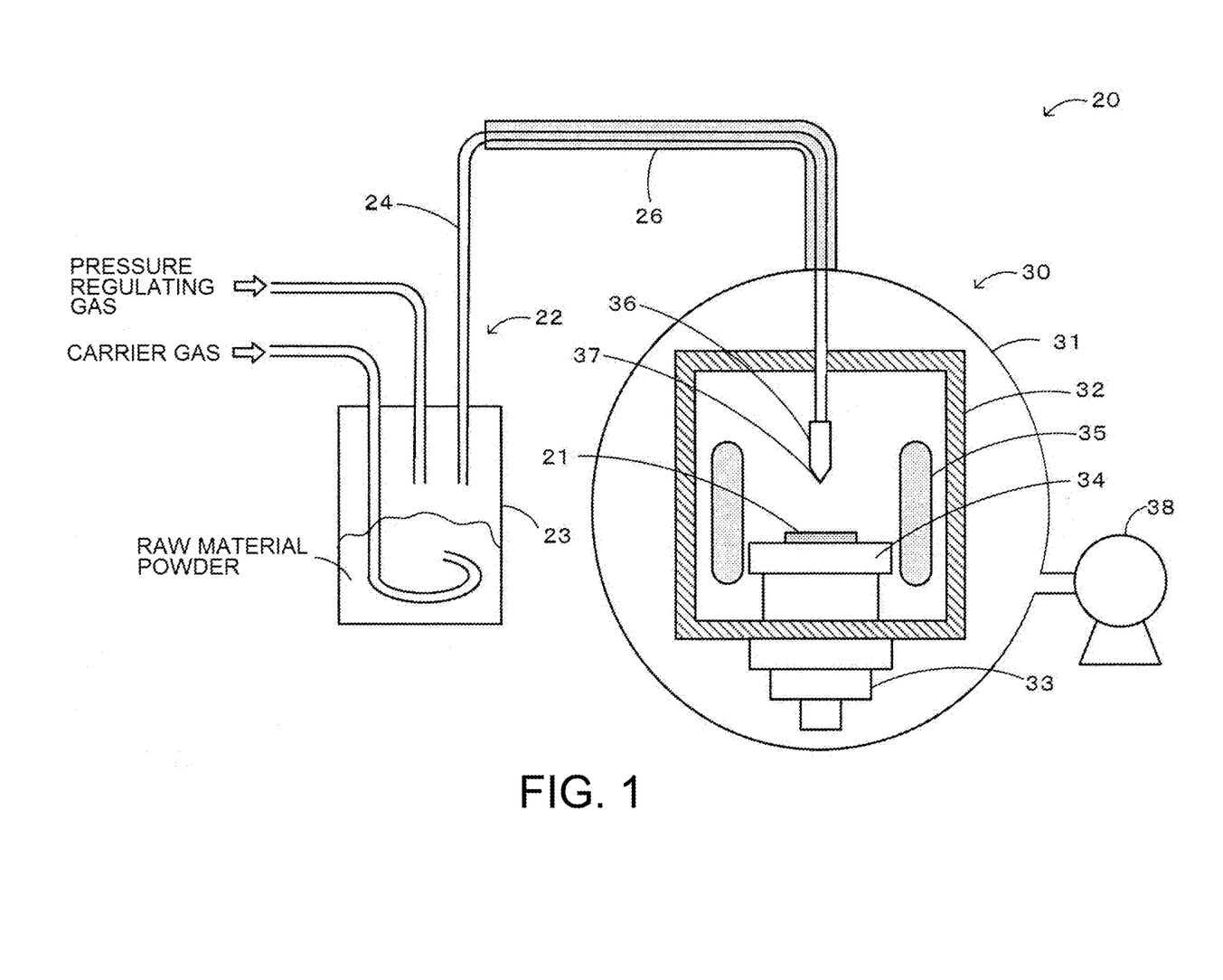
FIG. 1 is a schematic diagram showing an outline of the configuration of a crystal production apparatus 20.

Next, an embodiment of the method of the present invention will now be described using the drawings. FIG. 1 is a schematic diagram showing an outline of the configuration of a crystal production apparatus 20 used in the production method of the present invention. The crystal production apparatus 20 is configured as an apparatus used for an aerosol deposition method (AD method) in which a raw material powder is injected onto a seed substrate under an atmosphere having a pressure lower than the atmospheric pressure. This crystal production apparatus 20 includes an aerosol generating part 22 for generating an aerosol of a raw material powder comprising raw material constituents and a crystal generating part 30 for injecting the raw material powder onto a seed substrate 21 to form a film comprising raw material constituents and also to crystallize the film. The aerosol generating part 22 includes an aerosol generating chamber 23 for accommodating the raw material powder and generating an aerosol upon receiving a supply of a carrier gas from a gas cylinder (not shown), and a raw material supply pipe 24 for supplying the generated aerosol to the crystal generating part 30. A preheating heater 26 for preheating the aerosol is provided on the crystal generating part 30 side of the raw material supply pipe 24, and the preheated aerosol is supplied to the crystal generating part 30. The crystal generating part 30 includes a vacuum chamber 31 where the aerosol is injected onto the seed substrate 21, a compartment-like heat insulator 32 provided in the vacuum chamber 31, a substrate holder 34 that is provided inside the heat insulator 32 and is for fixing the seed substrate 21, and an X-Y stage 33 for moving the substrate holder 34 in the X axis-Y axis direction. Also, the crystal generating part 30 includes a heating part 35 that is provided inside the heat insulator 32 and is for heating the seed substrate 21, an injection nozzle 36 at the tip of which a slit 37 is formed and that is for injecting the aerosol onto the seed substrate 21, and a vacuum pump 38 for reducing the pressure of the vacuum chamber 31. Components of the crystal production apparatus 20 are each composed using quartz glass, ceramic, and like members so as to enable heat treatment at a temperature at which the raw material powder undergoes single crystallization in the vacuum chamber 31. A crystal production method in which this crystal production apparatus 20 is used will now be described below.

In the film formation/crystallization step, film formation treatment is carried out in which, at a specific single crystallization temperature at which the raw material components undergo single crystallization, a raw material powder comprising the raw material components is injected to form a film comprising the raw material components on a seed substrate composed of a single crystal, and also crystallization treatment is carried out in which the film comprising the raw material is crystallized while retaining the specific single crystallization temperature.

In the AD method, the zinc oxide raw material powder is preferably composed of a primary particles without aggregation (particles not containing any grain boundaries within the particle), and the particle diameter is preferably, for example, 0.05 μm or greater and 10 μm or less, and more preferably 0.2 μm or greater and 4 μm or less. This particle diameter refers to the median diameter (D50) measured using a laser diffraction/scattering particle size distribution analyzer when particles are dispersed in a dispersion medium (such as an organic solvent or water). The raw material powder may be subjected to milling treatment by, for example, a ball mill, a planetary ball mill, or a jet mill in advance. Thereby the surface properties and the crystallinity of the particles are altered, thus making it possible to enhance the rate of film formation in the AD method. Also, heat treatment may be performed on the raw material powder. This makes it possible to enhance the density of the film to be formed by the AD method. In the film formation treatment, the seed substrate may be composed of the same components as the raw material components. This seed substrate may comprise a single crystal and, for example, may be a single crystal substrate or may be a support substrate on the surface of which a single crystal film is formed. Among these, the seed substrate is more preferably a single crystal substrate. The film formation treatment may be carried out at a specific single crystallization temperature at which the formed zinc oxide film undergoes single crystallization, preferably 900° C. or higher and more preferably 1000 to 1400° C. It is preferable that this single crystallization temperature is within a range that is lower than the melting point or the decomposition temperature of the raw material powder.

In the film formation treatment, it is more preferable that the carrier gas and the pressure regulating gas are inert gases. Concerning injection conditions, it is preferable to adjust the pressures of the carrier gas, the regulating gas and the vacuum chamber in a way such that a film is formed when injection is performed at room temperature and that the film structure thereof has a crystallite diameter of 100 nm or less and a density of 95% or greater. In this way, the single crystallization temperature can be lowered. The crystallite diameter can be measured from X-ray diffraction (the Scherrer method), and the density can be measured from an image analysis by cross-sectional SEM observation. It is preferable that a slit having a longer side and a shorter side is formed in the injection nozzle. For this slit, the longer side may be formed within the range of 1 mm or greater and 10 mm or less, and the shorter side may be formed within the range of 0.1 mm or greater and 1 mm or less. The thickness of the film formed by injecting the raw material powder is preferably 5 µm or less and more preferably 3 µm or less. The thickness of the film is preferably 0.1 µm or greater. When the thickness of the film is 5 µm or less, the density is further enhanced.

Figure 2:
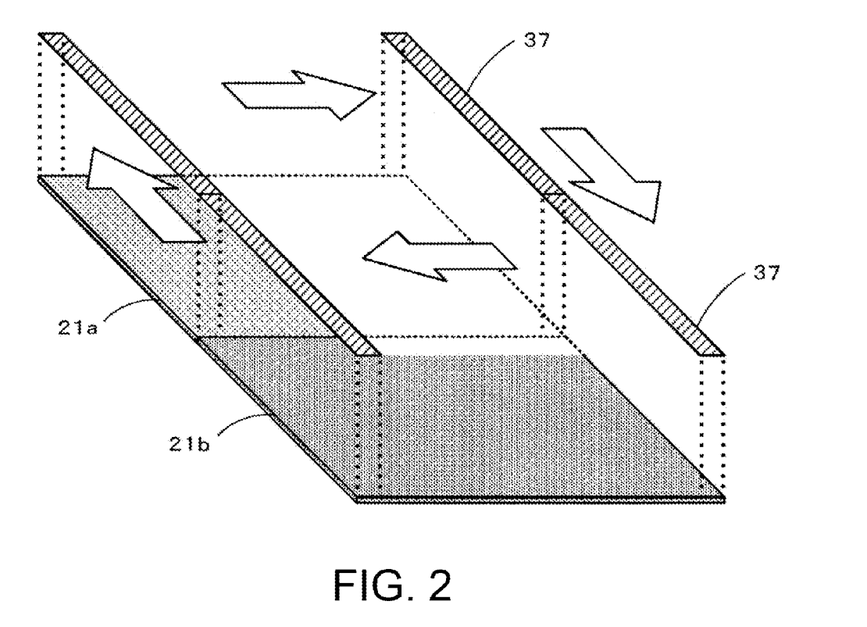
FIG. 2 is an explanatory diagram for a scanning method of a slit 37 shown in FIG. 1.

In this film formation treatment, when injecting the raw material powder from a slit having a longer side and a shorter side, this slit may scan the substrate. Scanning by the slit is not particularly limited, and the slit may scan in a way such that the film formation treatment is performed over the same region a few times, i.e., repetitive coating. FIG. 2 is an explanatory diagram for a scanning method of the slit 37. As shown in FIG. 2, when forming a film, the raw material powder is injected from the slit having a longer side and a shorter side, and also the slit and the seed substrate are moved in a relative manner in the direction perpendicular to the longer side, to form a film on the seed substrate (a first film formed region 21a). Here, the crystal production apparatus 20 of FIG. 1 is configured to move the seed substrate 21 by the X-Y stage 33, but it may be configured to move the injection nozzle 36 side. Next, the slit and the seed substrate are moved in a relative manner in the longer side direction, and then the slit and the seed substrate are moved in a relative manner in the direction perpendicular to the longer side over a region adjacent to the film formed on the seed substrate to form a new film (a second film formed region 21b) adjacent to the previously formed film. These scanning operations may be carried out repeatedly. Performing such scanning multiple times makes it possible to obtain a single crystal with a comparatively large area and also makes the interval of film formation in each instance uniform over the entire surface, thus giving a homogeneous single crystal. Moreover, it is possible to control the thickness of the single crystal to be produced. Here, the slit scans to draw a rectangular shape, but the slit may scan to draw a FIG. 8, may scan in a zigzag manner, or may scan back and forth. It is preferable for the slit to scan at a rate in accordance with the time when the film crystallizes due to the crystallization treatment, which will be described below. This scanning rate can be empirically determined according to the type of raw material and the single crystallization temperature, and is preferably within the range of, for example, 0.1 mm/s or greater and 10 mm/s or less. When injecting the raw material powder repeatedly, the next injection may be performed on a film that has been formed by the previous injection and has already crystallized, or the next injection may be performed on a film that has been formed by the previous injection but has not yet crystallized. In this film formation treatment, a portion not forming a single crystal may be left as long as the thickness of the portion not forming a single crystal is, for example, not greater than 2 µm.

Figure 3:
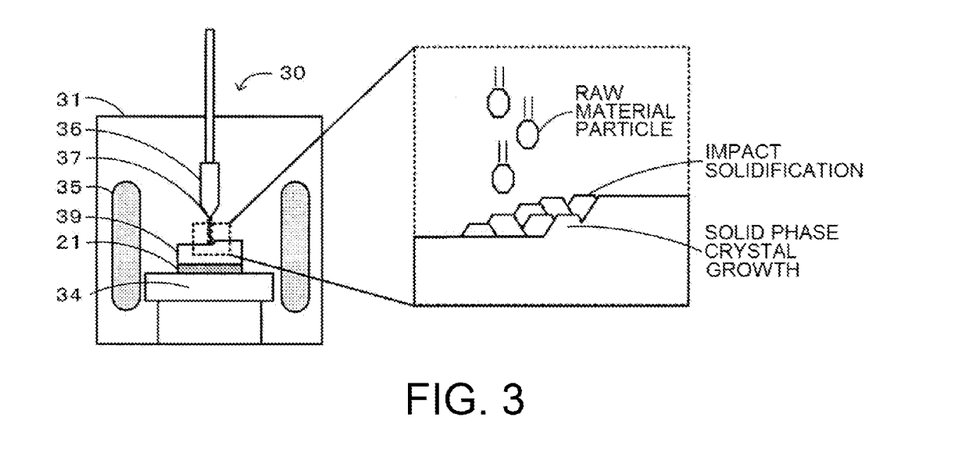
FIG. 3 is an explanatory diagram for crystallization treatment.

In the crystallization treatment, treatment is carried out while retaining the temperature of the above-described film formation treatment (single crystallization temperature). This crystallization treatment is a treatment for subjecting the film composed of raw material particles and formed on the substrate in the film formation treatment to a single crystallization temperature to crystallize the film. This single crystallization temperature is the same as the temperature described for the film formation treatment, and is preferably 900° C. or higher and more preferably 1000 to 1400° C. It is preferable that this single crystallization temperature is within a range that is lower than the melting point of the raw material powder. FIG. 3 is an explanatory diagram for the crystallization treatment. As shown in FIG. 3, in the film formation treatment, injected raw material particles collide with a substrate (seed substrate) to be impact-solidified on the the substrate to produce a film material 39. Since the atmosphere in which this film formation treatment is carried out has a single crystallization temperature, the impact-solidified raw material particles sequentially undergo solid-phase crystal growth and single crystallization, or growth of a highly oriented and dense crystal occurs. In this way, a three-dimensionally oriented crystal can be obtained. Although it is preferable that the resulting crystalline material is a single crystal, the resulting crystal may contain a portion that is not a single crystal or may be polycrystalline and three-dimensionally oriented.

According to the crystal production method of the embodiment described above, a crystal having better orientation and density can be prepared. Also, a crystalline material (single crystal) in which pores are extremely few and that has a large thickness can be obtained. Presumably, a reason for this is that, for example, in the crystal production method of this embodiment, film formation is carried out under heat treatment conditions where single crystallization occurs, and therefore a dense film structure created by film formation sequentially thickens while undergoing single crystallization, therefore pores are unlikely to be generated, and a crystal having better orientation and density can be prepared. Also, since raw material particles may be injected at a single crystallization temperature, crystal growth can be easily achieved using a zinc oxide raw material powder having a very high melting point.

The present invention is not limited to the above-described embodiment at all, and needless to say, the present invention can be carried out in various manners as long as they are within the technical scope of the present invention.

Figure 4:
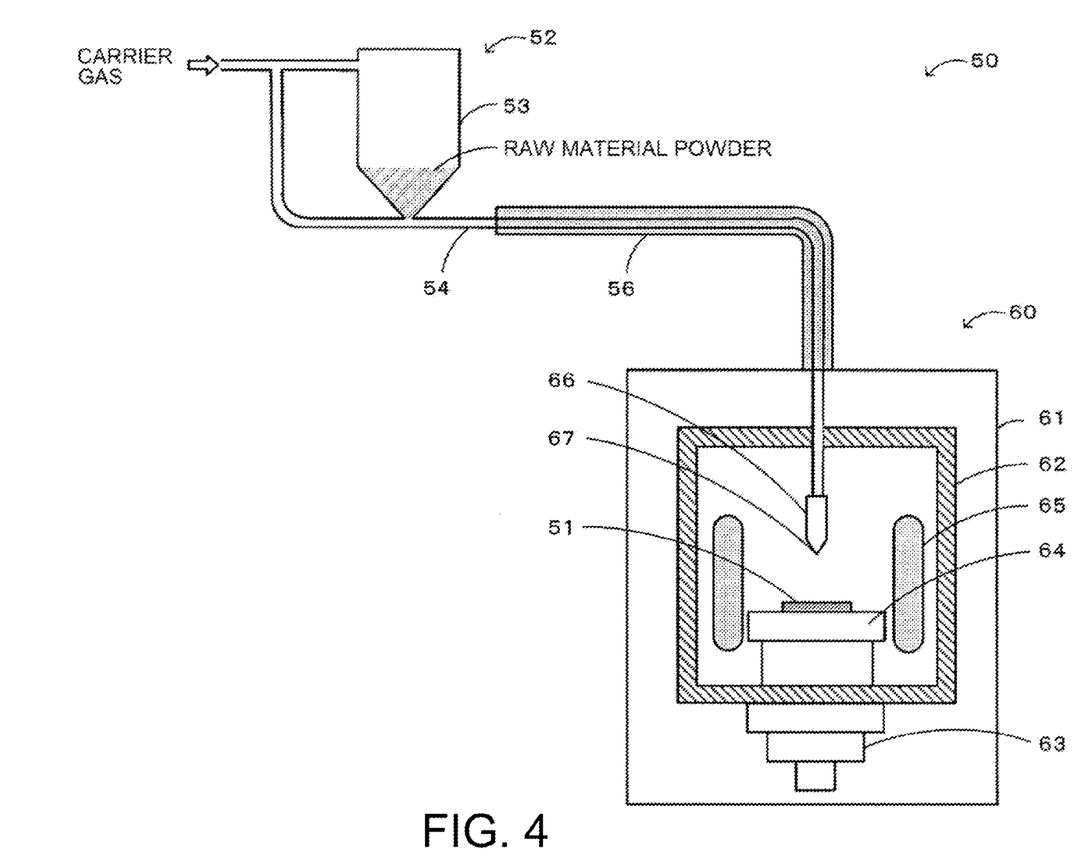
FIG. 4 is a schematic diagram showing an outline of the configuration of a crystal production apparatus 50.

For example, the above-described embodiment employs the crystal production apparatus 20 for use in an aerosol deposition method in which the raw material powder is injected onto a seed substrate in an air pressure lower than the atmospheric pressure, but the present invention is not particularly limited to this embodiment, and as shown in FIG. 4, a crystal production apparatus 50 for use in a powder jet deposition method in which the raw material powder is injected onto a seed substrate in an air pressure identical to the atmospheric pressure or in an atmosphere having an air pressure higher than the atmospheric pressure may be used. FIG. 4 is a structural diagram showing an outline of the configuration of the crystal production apparatus 50 used in the crystal production method of this embodiment. The crystal production apparatus 50 includes a jet powder generating part 52 for generating a raw material fluid comprising a raw material powder and a carrier gas, and a crystal generating part 60 where the raw material powder is injected onto a seed substrate 51 to form a film comprising raw material constituents and also to crystallize this film. The jet powder generating part 52 includes a pressure tank 53 for accommodating the raw material powder and receiving a supply of a carrier gas from a gas cylinder (not shown), and a raw material supply pipe 54 for supplying the generated aerosol to the crystal generating part 60. A preheating heater 56 for preheating the raw material fluid is provided on the crystal generating part 60 side of a raw material supply pipe 54, and the preheated raw material fluid is supplied to the crystal generating part 60. The crystal generating part 60 includes a chamber 61 for injecting the raw material fluid onto the seed substrate 51 under atmospheric pressure, a compartment-like heat insulator 62 provided in the chamber 61, a substrate holder 64 that is provided inside the heat insulator 62 and is for fixing the seed substrate 51, and an X-Y stage 63 for moving the substrate holder 64 in the X axis-Y axis direction. Also, the crystal generating part 60 includes a heating part 65 that is provided inside the heat insulator 62 and is for heating the seed substrate 51, and an injection nozzle 66 at the tip of which a slit 67 is formed and that is for injecting the raw material fluid onto the seed substrate 51. Components of the crystal production apparatus 50 are each composed of quartz glass, ceramic, and like members so as to enable heat treatment at a temperature at which the raw material powder undergoes single crystallization in the chamber 61. Then, using this crystal production apparatus 50, the film formation/crystallization step is carried out in which film formation treatment is performed in which, at a specific single crystallization temperature at which the raw material components undergo single crystallization, a raw material powder comprising the raw material constituents is injected to form a film comprising the raw material constituents on a seed substrate composed of a single crystal, and also crystallization treatment is performed in which the film comprising the raw material is crystallized while retaining the specific single crystallization temperature. At this time, as injection conditions, the pressures of the carrier gas and the chamber may be adjusted in a way such that a film is formed when injection is performed at room temperature and that the film structure thereof has a crystallite diameter of 100 nm or less and a density of 95% or greater. Regarding other conditions, crystal production can be carried out in accordance with the above-described conditions of the AD method. In this manner as well, a crystal having better orientation and density can be prepared.

Figure 5:
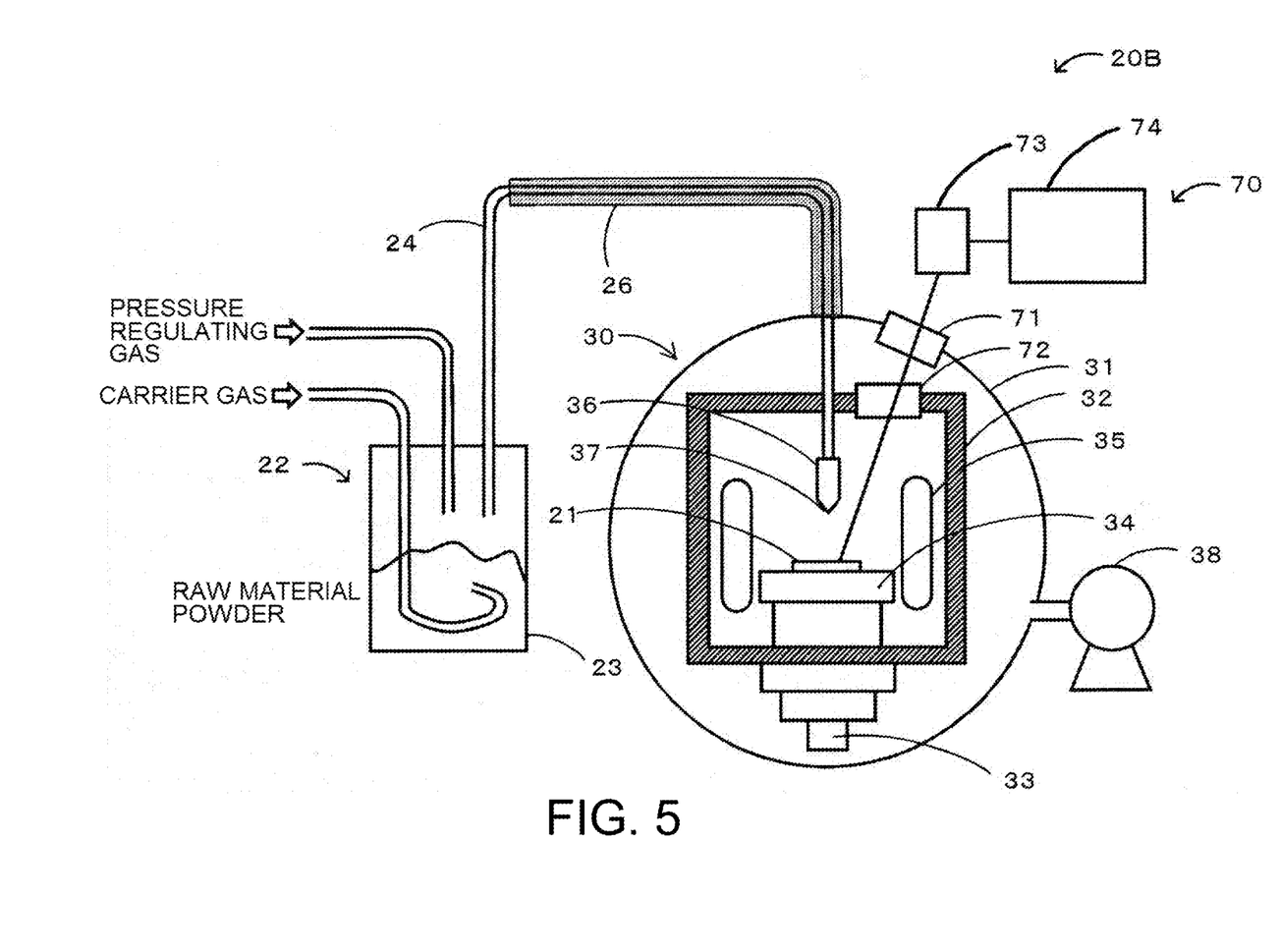
FIG. 5 is a schematic diagram showing an outline of the configuration of a crystal production apparatus 20B.

In the above-described embodiment, the crystal production apparatus 20 is configured in a way such that the entire film formation chamber including the seed substrate 21 (inside the heat insulator 32) is heated by the heating part 35 provided inside the heat insulator 32, but the present invention is not particularly limited to this embodiment. For temperature control of the film formation chamber (inside the heat insulator 32), in addition to the heating part 35 (heater) in the interior of the film forming chamber, another heating source may be provided to heat only the substrate portion. For example, as shown in FIG. 5, a heating apparatus 70 for heating the seed substrate 21 from outside the vacuum chamber 31 may be used in addition to the heating part 35. FIG. 5 is a structural diagram showing an outline of the configuration of a crystal production apparatus 20B. The crystal production apparatus 20B includes, in addition to the crystal production apparatus 20 (see FIG. 1), the heating apparatus 70 for emitting a laser. Here, in the crystal production apparatus 20B, components similar to the components of the crystal production apparatus 20 are provided with the same reference numbers, and the description thereof is omitted. In the crystal production apparatus 20B, the vacuum chamber 31 includes a transmissive window 71 between the heating apparatus 70 and the substrate holder 34, the heat insulator 32 includes a transmissive window 72, and it is thus possible to irradiate the substrate holder 34 with a laser from the heating apparatus 70. The heating apparatus 70 includes an optical system 73 that can adjust the range of laser irradiation onto the substrate holder 34 and a laser generator 74 for generating a laser for heating. This crystal production apparatus 20B is configured to be capable of entirely or partially heating the seed substrate 21 by irradiating the seed substrate 21 on the substrate holder 34 with a laser generated by the laser generator 74 via the optical system 73 and the transmissive windows 71 and 72. The heating source for the substrate portion is not particularly limited, and for example, in addition to various lasers such as $CO_2$ laser, YAG laser, excimer laser, and semiconductor laser, infrared lamps and the like are applicable. An infrared lamp may be installed near the seed substrate inside the chamber to heat the substrate portion, or may be installed outside the chamber and infrared ray is introduced using an infrared introductory rod. The aforementioned heating source saves the output of the heating part 35 and enables reduction of the amount of energy used when preparing a single crystal. Also, the seed substrate 21 can be directly heated, and the required heat resistance of the crystal generation part 30 is lowered, thus making it possible to improve selectivity and durability of the components constituting the crystal production apparatus 20. Heating the seed substrate 21 solely by a heating source that heats only the substrate portion may make film formation difficult due to the influence of a thermophoresis effect including a phenomenon in which a gas stream is pushed back from the substrate surface due to the temperature difference between the seed substrate 21 and the aerosol gas stream. Accordingly, it is preferable to use in combination the heating part 35 that heats the entire film formation chamber and a heating source (heating apparatus 70) that heats only the substrate portion and set the temperature difference between the film formation chamber and the seed substrate 21 to be within a specific range. It is preferable to bring temperature difference between the film formation chamber and the seed substrate 21 to be 700° C. or lower.

In the above-described embodiments, the injection nozzle is provided with a slit, but the present invention is not particularly limited thereto as long as the raw material powder can be injected, and the nozzle may be provided with a circular, oval, or polygonal hole.

In the above-described embodiments, the crystal production apparatuses 20 and 20B and the crystal production apparatus 50 are used, but the present invention is not particularly limited thereto, and an apparatus other than the crystal production apparatuses 20 and 20B and the crystal production apparatus 50 may be used as long as the film formation/crystallization step can be carried out.

Zinc Oxide Single Crystal

The zinc oxide single crystal obtained by the above-described production method of the present invention has a composition derived from the composition of the raw material powder, and comprises at least one dopant element selected from the group consisting of B, Al, Ga, In, C, F, Cl, Br, I, H, Li, Na, K, N, P, As, Cu, and Ag in a total amount of 0.01 at % or greater and 1 at % or less in a solid solution state. The zinc oxide single crystal generally has a hexagonal wurtzite structure. According to a preferable embodiment of the present invention, the zinc oxide single crystal comprises at least one group 3B element selected from B, Al, Ga, and In in an amount of 0.01 at % or greater and 0.99 at % or less and at least one group 7B element selected from F, Cl, Br, and I in an amount of 0.01 at % or greater and 0.99 at % or less. According to another preferable embodiment of the present invention, the zinc oxide single crystal comprises an n-type dopant element which is at least one selected from the group consisting of B, Al, Ga, In, C, F, Cl, Br, and I, or a p-type dopant element which is at least one selected from the group consisting of H, Li, Na, K, N, P, As, C, Cu, and Ag.

The zinc oxide single crystal according to a preferable embodiment of the present invention has such extremely high crystallinity that the X-ray rocking curve half-width of the (002) plane is 150 arcsec or less. That is, this half-width is defined as a peak width at a position where the height is half the (002) plane peak in an X-ray rocking curve, and means that the narrower the width, the higher the crystallinity. The X-ray rocking curve half-width of the (002) plane of the zinc oxide single crystal according to this embodiment is preferably 130 arcsec or less, and more preferably 100 arcsec or less. This half-width can be measured by, for example, analysis software (manufactured by Bruker AXS, LEPTOS) applied to a diffraction peak measured using an XRD measurement apparatus for thin-film material measurement (manufactured by Bruker AXS, "D8 DISCOVER"). Measurement of a diffraction peak can be carried out as follows: an X-ray source is configured to output a tube voltage of 40 kV and a tube current of 40 mA, a collimator is not used, the w axis, 2θ axis, and x axis are selected in this order relative to the (002) plane of the zinc oxide single crystal, and then w-scan measurement is performed over ±3° around the (002) peak. The measurement conditions at this time may include a step size of 0.001°, a scanning rate of 0.5 sec/step, and a scattering slit angle of 3°.

As stated above, the zinc oxide single crystal of the present invention has lattice constants close to those of a non-doped zinc oxide single crystal, preferably the a-axis lattice constant is 3.246 to 3.252 Å and the c-axis lattice constant is 5.204 to 5.210 Å, and more preferably the a-axis lattice constant is 3.248 to 3.251 Å and the c-axis lattice constant is 5.205 to 5.208 Å. Commonly used zinc oxide has an a-axis length of 3.2498 Å and a c-axis length of 5.2066 Å according to ICDD 36-1451.

The shape and the size of the zinc oxide single crystal of the present invention may be suitably determined according to the intended application, and are not particularly limited. For example, for applications to electronic device substrates such as zinc oxide single crystal substrates for use in light emitting devices, e.g., light emitting diodes (LEDs), it is preferable that the zinc oxide single crystal is formed into a plate having a thickness of 0.1 to 1 mm and preferably 0.2 to 0.8 mm. For applications to transparent conductive films, the zinc oxide single crystal may be formed into a film having a thickness of 0.05 to 5 μm and preferably 0.1 to 1 μm.

Method for Producing of Raw Material Powder

A zinc oxide raw material powder used for the above-described method for producing a zinc oxide single crystal, in which a dopant forms a solid solution or to which a dopant is added, may be produced by any method, irrespective of a solid phase method or a liquid phase method.

Production of a zinc oxide raw material powder by a solid phase method can be preferably carried out by mixing non-doped zinc oxide particles and particles of a compound such as an oxide of a dopant element by a ball mill or the like and heat-treating the mixture. This heat treatment may be carried out under conditions suitable for a solid phase reaction, and is preferably carried out at 900 to 1450° C. for 1 to 5 hours, and more preferably at 1000 to 1200° C. for 1 to 5 hours. When a raw material powder comprising a group 3B element and a group 7B element both in a solid solution state is prepared, it is preferable to use non-doped zinc oxide particles and particles of a compound such as an oxide of a dopant element both in a nano sized particle form. Also, when adding a group 7B element, in order to prevent volatilization of the group 7B element and allow it to form a solid solution in ZnO, it is preferable to carry out the heat treatment while adjusting the vapor pressure of the group 7B element to be equal to or greater than the atmospheric pressure in an airtight vessel. It is preferable to pulverize the heat-treated powder to a desired average particle diameter by performing, for example, rough crushing or ball mill pulverization. A preferable volume-based D50 average particle diameter of the raw material powder after pulverization is 0.2 to 4 μm.

Production of a zinc oxide raw material powder by a liquid phase method is suitable for preparing a raw material powder comprising a group 3B element and a group 7B element both in a solid solution state. That is, hydrothermal synthesis, which is a liquid phase method, enables production of a co-doped raw material powder by direct synthesis at a relatively low temperature without undergoing reheating treatment. More preferably, the zinc oxide raw material powder can be produced by subjecting an aqueous raw material solution comprising group 3B element ions, group 7B element ions, zinc ions, and carboxylic acid and/or carboxylate ions to hydrothermal synthesis at a temperature of 130° C. or higher. In the zinc oxide raw material powder produced by this method, each of the particles comprises in its interior a group 3B element and a group 7B element in a solid solution state. That is, the aqueous raw material solution comprises group 3B element ions, group 7B element ions, zinc ions, and carboxylic acid and/or carboxylate ions. A representative example of such an aqueous raw material solution is an aqueous zinc acetate solution. Since the aqueous raw material solution does not comprise an organic solvent, its environmental burden is small. Unexpectedly, subjecting this aqueous raw material solution to hydrothermal synthesis at a temperature of 130° C. or higher makes it possible to directly produce a zinc oxide raw material powder in which a group 3B element and a group 7B element form a solid solution, without requiring reheating treatment. In particular, the fine zinc oxide particles obtained by the method of the present invention without undergoing reheating treatment are, typically, extremely fine particles in the order of nanometers, and are characterized by little agglomeration and high dispersibility.

Although the reaction mechanism through which the zinc oxide raw material powder is directly obtained by the aforementioned method is not necessarily clear, it is considered to be because carboxylic acid or carboxylate ions thermally decompose during hydrothermal synthesis to produce ketenes and, at the same time, supply oxygen to zinc ions to produce ZnO. According to the inventors' understanding, in mere heating carried out under atmospheric pressure, which is not hydrothermal synthesis (i.e., not in a high-temperature and high-pressure vessel such as an autoclave), ketenes are not produced through decomposition of carboxylic acid or carboxylate ions present in the aqueous solution, and thus it is considered that the above-described reaction mechanism is specific to hydrothermal synthesis.

The aqueous raw material solution used in hydrothermal synthesis comprises group 3B element ions (preferably $Al^{3+}$ and/or $Ga^{3+}$), group 7B element ions (preferably $Cl^-$ and/or $Br^-$), zinc ions ($Zn^{2+}$), and carboxylic acid (—COOH) and/or carboxylate ions (—COO$^-$). The supply source of group 3B element ions is not particularly limited as long as it is a material that can dissolve in water to produce group 3B element ions, and water-soluble salts such as aluminum nitrate, aluminum chloride, gallium nitrate, and gallium chloride are preferable. The supply source of group 7B element ions is not particularly limited as long as it is a material that can dissolve in water to produce group 7B element ions, and preferable examples include cetyltrimethylammonium chloride (CTAC), lithium chloride, potassium chloride, cetyltrimethylammonium bromide (CTAB), lithium bromide, potassium bromide, and the like. Cetyltrimethylammonium chloride (CTAC) and cetyltrimethylammonium bromide (CTAB) are particularly preferable because they facilitate incorporation into zinc oxide particles as surfactants, and cetyltrimethylammonium bromide (CTAB) is most preferable. The supply source of zinc ions is not particularly limited as long as it is a salt capable of supplying zinc ions, and preferable examples include zinc acetate, zinc nitrate, zinc chloride, and the like, and zinc acetate is particularly preferable because it simultaneously functions as a supply source of carboxylate ions. In this regard, when zinc acetate is not used, it is necessary to supply carboxylic acid or carboxylate ions to the reaction system through another substance. Examples of carboxylic acids include formic acid, oxalic acid, acetic acid, and the like. When carboxylic acid is used, it is preferable to adjust the pH of the aqueous raw material solution to 3 to 8 using a base such as ammonia. Various carboxylic acid salts are usable as a supply source of carboxylate ions, and preferable examples thereof include, in addition to the aforementioned zinc acetate, zinc formate, zinc oxalate, ammonium formate, ammonium oxalate, ammonium acetate, and the like. Particularly preferable carboxylic acid and/or carboxylate ions are acetic acid and/or acetate ions. The concentration of the aqueous raw material solution is not limited, and it is preferable that the aqueous raw material solution comprises group 3B element ions in a concentration of 0.0001 to 0.02 M, zinc ions in a concentration of 0.01 to 2 M, and carboxylic acid and/or carboxylate ions in a concentration of 0.02 to 4 M.

The pH of the aqueous raw material solution is not particularly limited, and it is mostly within the region from neutral to acidic, for example, pH 8.0 or lower is preferably, and pH 7.0 or lower is more preferable. When the pH is within such a range, it is not necessary to use a base-resistant reaction apparatus, and the process is greatly simplified, thus enabling reduction of production costs.

Hydrothermal synthesis is carried out preferably at a temperature of 130° C. or higher, more preferably 140° C. or higher, and even more preferably 160 to 250° C. The time of hydrothermal synthesis is not particularly limited as long as the desired fine particles are formed, and it is preferable that hydrothermal synthesis is carried out within the aforementioned temperature range for 1 hour or longer, and preferably for 3 to 10 hours. For example, hydrothermal synthesis is preferably carried out at a temperature of 140° C. or higher for 1 hour or longer, and more preferably carried out at a temperature of 160 to 250° C. for 3 to 10 hours. Hydrothermal synthesis is generally defined as a method for synthesizing a material and for growing a crystal carried out in the presence of hot water, especially high-temperature and high-pressure water, and is typically carried out in an autoclave and preferably carried out therein, but other high-temperature and high-pressure vessels may be used as well.

The aqueous raw material solution used in hydrothermal synthesis preferably comprises a surfactant in a concentration of 0.01 M or greater, and more preferably 0.01 to 2 M. In the presence of a surfactant, dopants such as group 3B elements and group 7B elements can successfully form a solid solution in the interior of zinc oxide particles. Examples of surfactants include cetyltrimethylammonium chloride (CTAC), cetyltrimethylammonium bromide (CTAB), polyvinyl alcohol (PVA), polyethylene glycol (PEG), ethylene glycol, polyvinylpyrrolidone (PVP), and the like. Preferable surfactants are cetyltrimethylammonium chloride (CTAC) and cetyltrimethylammonium bromide (CTAB) because they also function as supply sources of group 7B elements, and these surfactants not only facilitate incorporation of group 7B elements into the interior of zinc oxide particles but also simultaneously facilitate incorporation of group 3B elements into the crystal. Cetyltrimethylammonium bromide (CTAB) is particularly preferable. In this way, group 3B elements and/or group 7B elements can successfully form a solid solution in the interior of zinc oxide particles in the presence of a surfactant. Although the reason why these elements successfully form a solid solution is not necessarily clear, it is considered to be because group 3B element ions and group 7B element ions are present in the micelle formed by the surfactant, and effectively incorporated during the course of zinc oxide production in the hydrothermal reaction.

In the above-described manner, zinc oxide particles can be directly synthesized by hydrothermal synthesis. When a zinc oxide single crystal is produced by injection as described above, it is preferable to calcine zinc oxide particles obtained by the above-described hydrothermal synthesis at 400 to 1100° C. for 2 hours or longer to allow the particles to grow to have a volume-based D50 average particle diameter of 0.05 to 10 µm. More preferable calcination conditions include a temperature of 500 to 800° C. and a duration of 4 to 8 hours, and a more preferable volume-based D50 average particle diameter is 0.2 to 4 µm.

EXAMPLES

The present invention will now be more specifically described by way of the following examples.

Example 1

(1) Preparation of Zinc Oxide Powder and Evaluation of Dopant Content

Zinc acetate dihydrate (manufactured by Kishida Chemical Co., Ltd.) and aluminum nitrate nonahydrate (manufactured by Kishida Chemical Co., Ltd.) were dissolved in Milli-Q water (ultrapure water) such that the total molar amount of Zn and Al was 0.2 M. At this time, the molar ratio between Zn and Al, i.e., Zn:Al, was 99.7:0.3. To the solution obtained in this way was added cetyltrimethylammonium bromide (CTAB) (manufactured by Kishida Chemical Co., Ltd.) to give a concentration of 0.1 M. This mixed solution was heated at 180° C. for 6 hours in an autoclave to produce a powder. The produced powder was calcined in air at 600° C. for 12 hours to grow particles having a volume-based D50 average particle diameter of 2 µm. Identification of the crystal phase of the resulting powder using X-ray diffractometry (XRD) resulted in a ZnO single phase. The Al content (i.e., the amount of Al forming a solid solution) in the powder measured by ICP-AES was 0.28 at %. The Br content (i.e., the amount of Br forming a solid solution) measured by ion chromatography was 0.12 at %.

The lattice constants of the powder were measured using X-ray diffractometry under the following conditions: X-ray: CuKα radiation, tube voltage: 45 kV, tube current: 40 mA, measurement mode: step scan, step size: 0.01°, counting time: 1 s/degree, scan range: 27.5 to 40 (2θ). At this time, Si, the lattice constants of which were already known, was used as an internal standard, and the a-axis lattice constant and the c-axis lattice constant of the zinc oxide powder were determined using the (100) and (002) peak positions of zinc oxide obtained by the peak-top method and CuKα1 radiation with a wavelength of λ=1.5418 Å. As a result, the a-axis length was 3.2483 Å and the c-axis length was 5.2062 Å, and therefore, for both axes, values close to the lattice constants of ordinary zinc oxide (the a-axial length is 3.2498 Å and the c-axis length is 5.2066 Å according to ICDD 36-1451) were obtained.

(2) Growth of Zinc Oxide Single Crystal

Using the zinc oxide powder obtained above as a raw material powder and a zinc oxide single crystal substrate (10 mm×10 mm square, C plate) as a seed substrate, a zinc oxide single crystal was produced by the crystal production apparatus shown in FIG. 1. This apparatus is an apparatus in which the temperature inside the chamber may be 1200° C. and that is for producing a crystal by an aerosol deposition (AD) method. In this apparatus, injection of an aerosol was performed using He as a carrier gas and also as a pressure regulating gas and using a ceramic nozzle in which a slit having a 5 mm longer side x a 0.4 mm shorter side was formed. At this time, the nozzle was moved for scan at a scanning rate of 0.5 mm/s. This scan was carried out as shown in FIG. 2 by repeating 200 times a cycle consisted of moving the nozzle 10 mm in the perpendicular and forward direction relative to the longer side of the slit, moving the nozzle 5 mm in the longer side direction of the slit, moving the nozzle 10 mm in the perpendicular and backward direction relative to the longer side of the slit, and moving the nozzle 5 mm in the longer side direction of the slit toward the initial position. In one cycle of film formation at room temperature, the pressure of the carrier gas was adjusted to 0.06 MPa, the flow rate thereof was adjusted to 6 L/min, the flow rate of the pressure regulating gas was adjusted to 0 L/min, and the pressure inside the chamber was adjusted to no higher than 100 Pa. At this time, the film had a crystallite diameter of 100 nm or less and a density of 95% or greater. In these injecting conditions, the temperature of the film formation chamber, i.e., the temperature at which the single crystal grew, was set to be 1150° C. as a crystal growth condition. The resulting single crystal sample had a thickness of 0.5 mm.

(3) Measurement of Crystallinity

The crystallinity of the single crystal sample was measured using an XRD measurement apparatus for thin-film material measurement (manufactured by Bruker AXS, "D8 DISCOVER"). At this time, the X-ray source was configured to output a tube voltage of 40 kV and a tube current of 40 mA, and no collimator was used in order to increase diffraction intensity. The w axis, 2θ axis, and x axis were selected in this order relative to the (002) plane of the zinc oxide sample, and then w-scan measurement was performed over ±3° around the (002) peak. The measurement conditions included a step size of 0.001°, a scanning rate of 0.5 sec/step, and a scattering slit angle of 3°. From the diffraction peak thus obtained, a half-width was obtained by analysis software (manufactured by Bruker AXS, LEPTOS). As a result, the XRC half-width was as small a value as 130 arcsec, and a single crystal having good crystallinity was obtained.

(4) Elemental Analysis

After the seed crystal portion that adhered to the single crystal sample was removed by mechanical polishing, the single crystal sample was sufficiently washed using acetone. The Al content (i.e., the amount of Al forming a solid solution) measured by ICP-AES performed on this single crystal sample was 0.28 at %, and the Br content (i.e., the amount of Br forming a solid solution) measured by ion chromatography was 0.11 at %.

(5) Measurement of Lattice Constant

The lattice constants of the single crystal sample were measured using an XRD measurement apparatus for thin-film material measurement (manufactured by Bruker AXS, "D8 DISCOVER"). At this time, the X-ray source was configured to output a tube voltage of 40 kV and a tube current of 40 mA, and no collimator was used in order to increase diffraction intensity. After selecting the x axis and the w axis for the (100) plane and the (002) plane, 2θ-θ scan was carried out, and the peak position was determined by analysis software LEPTOS. The a-axis length was obtained from the peak position of the (001) plane, and the c-axis length was obtained from the peak position of the (002) plane. As a result, the single crystal had lattice constants with an a-axis length of 3.2482 Å and a c-axis length of 5.2060 Å.

(6) Evaluation of Film Formation Reproducibility

A film was formed by an AD method under conditions similar to "(2) Growth of zinc oxide single crystal" except that the temperature of the film formation chamber was room temperature and a part of the film forming portion on the substrate was masked with kapton tape. The kapton tape was peeled off after film formation, and the level difference between the masked portion and the film formed portion was measured by a compact form/roughness analyzer (manufactured by Taylor-Hobson Ltd., "Form Talysurf plus") to determine the film thickness. This measurement was carried out 10 times, and a film thickness of no less than 0.1 mm was obtained in all instances.

Example 2

Preparation and evaluation of a zinc oxide powder and a zinc oxide single crystal sample were carried out as in Example 1 except that the molar ratio between Zn and Al, i.e., Zn:Al, was 99.9:0.1 and the CTAB concentration was 0.03 M. The Al and Br contents of the raw material zinc oxide powder were 0.09 at % and 0.04 at %, respectively, and the raw material zinc oxide powder had an a-axis lattice constant of 3.2492 Å and a c-axis lattice constant of 5.2060 Å. The resulting zinc oxide single crystal had an XRC half-width of 100 arcsec, showing high crystallinity. The Al content (i.e., the amount of Al forming a solid solution) was 0.09 at %, and the Br content (i.e., the amount of Br forming a solid solution) was 0.04 at %. Measurement of the lattice constants of the single crystal sample resulted in an a-axis lattice constant of 3.2491 Å and a c-axis lattice constant of 5.2067 Å. Regarding the evaluation of film formation reproducibility, a film thickness of no less than 0.1 mm was obtained in 9 out of 10 measurements.

Example 3

A zinc oxide powder having a volume-based D50 average particle diameter of 0.5 μm (manufactured by Kojundo Chemical Lab. Co., Ltd., purity of 4 N) and high-purity γ-$Al_2O_3$ powder (AKP-GO15 manufactured by Sumitomo Chemical Co., Ltd.) were mixed in a pot mill for 24 hours using water as a solvent and alumina balls in a way such that the molar ratio of Zn and Al, i.e., Zn:Al, was 99.7:0.3. The mixture was dried and then heat-treated at 1400° C. for 5 hours. The resulting powder was roughly crushed by a mortar, and then pulverized by a ball mill using alumina balls to give a volume-based D50 average particle diameter of 2 μm. Identification of the crystal phase by X-ray diffractometry performed on the resulting powder as in Example 1 resulted in a ZnO single phase. Also, the Al content in the powder measured by a method similar to Example 1 was 0.29 at %. Measurement of the lattice constants of the powder resulted in an a-axis lattice constant of 3.2462 Å and a c-axis lattice constant of 5.2025 Å, and thus the values were both smaller than those of commonly used ZnO. Preparation and evaluation of a zinc oxide single crystal were carried out by a method similar to Example 1 using this ZnO powder as a raw material. The resulting zinc oxide single crystal had an XRC half-width of 450 arcsec, showing relatively low crystallinity. The Al content (i.e., the amount of Al forming a solid solution) was 0.30 at %, and the Br content (i.e., the amount of Br forming a solid solution) was below the detection limit. Measurement of the lattice constants of the single crystal resulted in an a-axis lattice constant of 3.2463 Å and a c-axis lattice constant of 5.2027 Å. Evaluation of film formation reproducibility by a method similar to Example 1 resulted in that a film thickness of no less than 0.1 mm was obtained in 8 out of 10 measurements.

Example 4

A zinc oxide powder having a volume-based $D_{50}$ average particle diameter of 0.5 μm (manufactured by Kojundo Chemical Lab. Co., Ltd., purity of 4 N) and $Cu_2O$ powder (manufactured by Kojundo Chemical Lab. Co., Ltd.) were mixed in a pot mill for 24 hours using water as a solvent and alumina balls in a way such that the molar ratio of Zn and Cu, i.e., Zn:Cu, was 99.9:0.1. The mixture was dried and then heat-treated at 1000° C. for 5 hours. The resulting powder was roughly crushed by a mortar, and then pulverized by a ball mill using alumina balls to give a volume-based $D_{50}$ average particle diameter of 2 μm. Identification of the crystal phase by X-ray diffractometry performed on the resulting powder as in Example 1 resulted in a ZnO single phase. Also, the Cu content in the powder measured by a method similar to Example 1 was 0.04 at %. Measurement of the lattice constants of the powder resulted in an a-axis lattice constant of 3.2450 Å and a c-axis lattice constant of 5.2064 Å, and values close to those of commonly used ZnO were thus obtained. Using this ZnO powder as a raw material, preparation and evaluation of a zinc oxide single crystal were carried out by a method similar to Example 1. The resulting zinc oxide single crystal had an XRC half-width of 140 arcsec, showing high crystallinity. The Cu content (i.e., the amount of Cu forming a solid solution) in the crystal was 0.04 at %. Measurement of the lattice constants of the single crystal resulted in an a-axis lattice constant of 3.2451 Å and a c-axis lattice constant of 5.2066 Å. Also, evaluation of film formation reproducibility by a method similar to Example 1 resulted in that a film thickness of no less than 0.1 mm was obtained in 8 film formations out of 10 film formation experiments.

Example 5 (Comparative)

A zinc oxide powder having a volume-based $D_{50}$ average particle diameter of 0.5 μm (manufactured by Kojundo Chemical Lab. Co., Ltd., purity of 4 N) was heat-treated at 1400° C. for 5 hours. The resulting powder was roughly crushed by a mortar, and then pulverized by a ball mill using alumina balls to give a volume-based $D_{50}$ average particle diameter of 2 μm. Measurement of the amounts of impurities in the powder by a method similar to Example 1 revealed that all impurities were below their detection limits. Evaluation of film formation reproducibility by a method similar to Example 1 using the resulting powder resulted in that a film thickness of no less than 0.1 mm was obtained in only one instance out of 10 film formation experiments.

Example 6 (Comparative)

A zinc oxide powder having a volume-based $D_{50}$ average particle diameter of 0.5 μm (manufactured by Kojundo Chemical Lab. Co., Ltd., purity of 4 N) and a high-purity γ-$Al_2O_3$ powder (AKP-GO15 manufactured by Sumitomo Chemical Co., Ltd.) were mixed in a pot mill for 24 hours using water as a solvent and alumina balls in a way such that the molar ratio of Zn and Al, i.e., Zn:Al, was 98.0:2.0. The mixture was dried and then heat-treated at 1400° C. for 5 hours. The resulting powder was roughly crushed by a mortar, and then pulverized by a ball mill using alumina balls to give a volume-based $D_{50}$ average particle diameter of 2 μm. An examination of the crystal phase by X-ray diffractometry performed on the resulting powder as in Example 1 resulted in identification of $ZnAl_2O_4$ in addition to ZnO. Although attempts were made to produce a zinc oxide single crystal by a method similar to Example 1 using this powder as a raw material, the AD film did not undergo single crystallization. It is presumed that the $ZnAl_2O_4$ phase inhibited the single crystallization of the AD film.

What is claimed is:

1. A method for producing a zinc oxide single crystal, comprising the steps of:
    providing a raw material powder that comprises zinc oxide, at least one dopant element selected from the group consisting of B, Al, Ga, In, C, F, Cl, Br, I, H, Li, Na, K, N, P, As, Cu, and Ag in a total amount of 0.01 at % or greater and 1 at % or less, and is substantially free of a crystal phase other than the zinc oxide; and
    injecting the raw material powder to form a film comprising the zinc oxide on a seed substrate comprising a zinc oxide single crystal and also to crystallize the formed film in a solid phase state at a temperature of 900° C. or higher, thereby obtaining the zinc oxide single crystal in which the dopant element forms a solid solution, wherein the zinc oxide in the raw material powder has an a-axis lattice constant of 3.246 to 3.252 Å and a c-axis lattice constant of 5.204 to 5.210 Å.

2. The method according to claim 1, wherein the raw material powder comprises at least one group 3B element selected from the group consisting of B, Al, Ga, and In in an amount of 0.01 at % or greater and 0.99 at % or less and at least one group 7B element selected from F, Cl, Br, and I in an amount of 0.01 at % or greater and 0.99 at % or less.

3. The method according to claim 1, wherein the raw material powder comprises Al and Br.

4. The method according to claim 1, wherein the dopant element is an n-type dopant element which is at least one selected from the group consisting of B, Al, Ga, In, C, F, Cl, Br, and I.

5. The method according to claim 1, wherein the dopant element is a p-type dopant element which is at least one selected from the group consisting of H, Li, Na, K, N, P, As, C, Cu, and Ag.

\* \* \* \* \*